United States Patent [19]

Possley et al.

[11] Patent Number: 4,692,787
[45] Date of Patent: Sep. 8, 1987

[54] PROGRAMMABLE READ-ONLY-MEMORY ELEMENT WITH POLYCRYSTALLINE SILICON LAYER

[75] Inventors: Glen G. Possley, Lewisville; Earl C. Wilson, Houston, both of Tex.

[73] Assignee: Texas Instruments Incorporated, Dallas, Tex.

[21] Appl. No.: 476,888

[22] Filed: Mar. 18, 1983

Related U.S. Application Data

[63] Continuation of Ser. No. 153,463, May 23, 1980, abandoned.

[51] Int. Cl.⁴ .................... H01L 29/04; H01L 27/04
[52] U.S. Cl. ........................................ 357/59; 357/50; 357/86
[58] Field of Search ............................ 357/50, 59, 86

[56] References Cited

U.S. PATENT DOCUMENTS 3,742,592  7/1973  Rizzi et al. .................... 357/86
4,312,046  1/1982  Taylor ............................ 357/59

OTHER PUBLICATIONS

Electronic Design (Jul. 5, 1979), p. 31.

Primary Examiner—Gene M. Munson
Attorney, Agent, or Firm—Leo N. Heiting; N. Rhys Merrett; Melvin Sharp

[57] ABSTRACT

A programmable read-only-memory (PROM) element is disclosed in which an N-type epitaxial layer, grown on a P-type substrate with an N+ buried layer therebetween, has a P-type anode region formed in a surface portion thereof. An N-type poly-silicon layer is formed on the surface of the anode region, generally within an aperture in an insulating layer, with the dopant of the poly-silicon layer being diffused downwardly into the anode region to form a shallow N-type cathode region. A metal layer is deposited on the surface of the poly-silicon layer over the anode region, and a low resistivity path is provided to the buried layer. To program the memory element, a positive potential is applied to the metal layer relative to the buried layer to break down the barrier between the cathode and anode regions. As the reverse current flow heats the poly-silicon, the metal alloys through the poly-silicon and the cathode region, and shorts to the anode region.

11 Claims, 4 Drawing Figures

PROGRAMMABLE READ-ONLY-MEMORY ELEMENT WITH POLYCRYSTALLINE SILICON LAYER

This is a continuation of application Ser. No. 153,463, filed May 23, 1980, now abandoned.

BACKGROUND OF THE INVENTION

1. Field of the Invention

This invention relates generally to semiconductor programmable read-only-memories (PROMs), and more particularly to a programmable read-only-memory element having a vertical structure.

2. Prior Art Statement

Generally, monolithic semiconductor read-only-memory (ROM) devices are programmed during the manufacturing process, by building the program into the structure of an array of memory elements. Once manufactured, the program in the ROM cannot be altered or changed, since such changes require modifications to the programming masks employed during fabrication. In addition, the cost of manufacturing a ROM to a particular customer's requirements is large and economically prohibitive unless a large number of devices with the same ROM program are manufactured. These problems led to the development of the programmable read-only-memory (PROM) in which the manufacturer uses a standard process for all parts, and the customer programs the individual parts as desired. Generally, such PROMs use relatively large metallic fusible links that are melted or vaporized to create an open circuit. However, the relatively high level of programming current required by such devices demands high-power programming transistors which tend to be both slow and space consuming. Another problem with present PROMs is that the fusible link will sometimes "grow back" and thus change the ROM code.

SUMMARY OF THE INVENTION

A programmable read-only-memory element is fabricated by forming a P-type anode region in a surface portion of an N-type epitaxial layer which has been grown on a P-type substrate with an N+ buried layer therebetween. An N+ polycrystalline silicon layer is formed on the surface of the anode region via an aperture in an insulating layer deposited on the surface of the epitaxial layer. The dopant of the poly-silicon layer is diffused downward into the surface of the anode region to form a shallow cathode region. A metal layer is deposited on the surface of the poly-silicon layer over the anode region and a low resistivity path is provided to the buried layer. To program a memory element, a positive potential is applied to the metal layer relative to the buried layer to break down the barrier between the cathode and anode regions. As the reverse current flow heats the poly-silicon, the metal alloys therethrough and shorts to the anode region.

One object of the present invention is to provide a programmable read-only memory element requiring a relatively low level of programming current.

Another object of the present invention is to provide a programmable read-only memory element having a relatively small cell size.

One other object of the present invention is to provide a programmable read-only-memory element having improved reliability through elimination of fuse "grow back."

Other objects and advantages of the present invention will be evident from the following detailed description when read in conjunction with the accompanying drawings which illustrate one preferred embodiment thereof.

DESCRIPTION OF THE PREFERRED EMBODIMENT

Figure 1A:
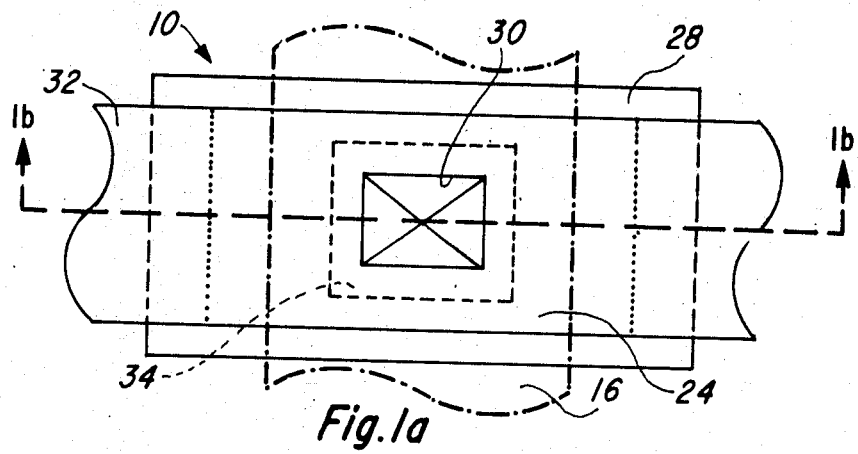
FIG. 1a is a plan view of a programmable read-only-memory element constructed in accordance with the preferred embodiment of the present invention.
Figure 1B:
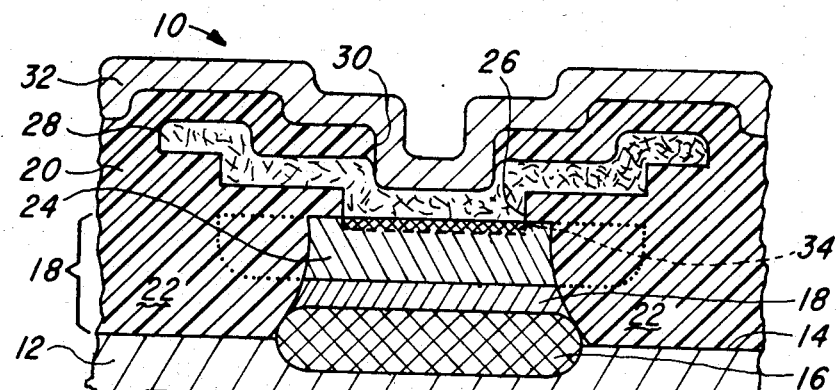
FIG. 1b is a cross-sectional view of the memory element of FIG. 1a taken along the line 1b—1b therein.

In the preferred method for fabricating the programmable read-only-memory (PROM) element 10 shown in FIGS. 1a and 1b, a P-type monocrystalline silicon substrate 12 of 10–20 ohm-cm cut on the 100 orientation has a major surface 14 thereof oxidized and patterned to receive an arsenic implant which, after a subsequent diffusion driving step, forms a buried layer 16 with a relatively low resistivity of the order of 15–25 ohms/square and a depth of about 4–10 microns. Following oxide removal, an N-type epitaxial layer 18 having a resistivity of 0.5–2.5 ohm-cm is grown on the surface 14 of the substrate 12 to a thickness of 1–3 microns. Selected portions of the epitaxial layer 18 are then removed, and the remaining portions oxidized to form an oxide insulating layer 20 having conventional oxide isolation regions 22. After the insulating layer 20 has been selectively removed to expose the surface of the epitaxial layer 18, a P-type anode region 24 is formed by a boron implant dose on the order of $8 \times 10^{14}$ ions/cm$^2$ at 90 KeV, so that the anode region 24 will have a resistance of 170–230 ohms/square and a depth of 0.6–0.8 microns following heat treatment. Following further oxidation and patterning, deep phosphorus diffusions (not shown) are formed in the surface of the epitaxial layer 18 to provide a low resistivity path to the buried layer 16. After removal of the diffusion debris, an aperture 26 is made in the insulating layer 20 over the anode region 24. A polycrystalline silicon (poly-silicon) layer 28 is then deposited on the layer 20 and the exposed portions of the anode region 24 to a thickness of about 2400 Angstroms, and subjected to an arsenic implant dose on the order of $3-6 \times 10^{15}$ ions/cm$^2$ at 40–80 KeV. Photoresist (not shown) is then applied and patterned to protect the portion of the poly-silicon layer 28 over the anode region 24, while the remaining portions are removed by plasma etching. After further conventional processing to form the emitters and collectors of the desired control circuitry, oxide is again grown and a contact window 30 formed to expose the surface of the poly-silicon layer 28. A metal layer 32, such as 2 percent copper-doped aluminum, is then deposited to a thickness of about 7000 Angstroms and patterned to leave metal on the portion of the poly-silicon layer 28 over the anode region 24. During these processing steps, a portion of the arsenic implanted into the poly-silicon layer 28 will diffuse downward into the anode region 24 to form a shallow N-type cathode region 34.

Figure 1C:
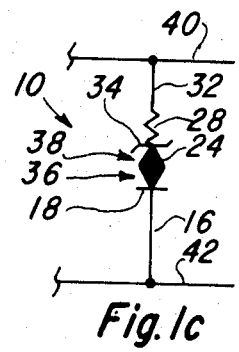
FIG. 1c is an electrical schematic representation of the memory element of FIGS. 1a and 1b.

As shown schematically in FIG. 1c, the P-N junction at the interface of the anode region 24 and the epitaxial layer 18 forms a decoupling diode 36 relative to the conductive buried layer 16, while the P-N junction at the interface of the anode region 24 and the cathode region 34 forms a programming diode 38 relative to the conductive metal layer 32. Thus, an unprogrammed memory element 10 prevents the flow of current between the metal layer 32 and the buried layer 16, due to the back-to-back configuration of the decoupling and programming diodes 36 and 38, respectively.

In the preferred embodiment, the programming diode 38 has a relatively low breakdown or Zener threshold which, when exceeded, allows current to flow from the metal layer 32 to the buried layer 16 through the relatively high resistivity poly-silicon layer 28. If the level of current exceeds a "programming" level, power dissipation across the P-N junction between the anode region 24 and the cathode region 34 rapidly heats the poly-silicon layer 28 and the overlying metal layer 32, allowing some of the metal comprising the metal layer 32 to alloy or "spike" through into contact with the anode region 24. As soon as the metal shorts to the anode region 24, destroying the programming diode 38, resistive heating effects drop sharply and the migration of the metal soon terminates. Preferably, the depth of the anode region 24 is sufficient to assure that the metal shorts stop well above the P-N junction between the anode region 24 and the epitaxial layer 18. Thus, a programmed memory element 10 allows current to flow from the metal layer 32 to the buried layer 16, due to the elimination of the programming diode 38, but not in the reverse direction because of the decoupling diode 36.

Figure 2:
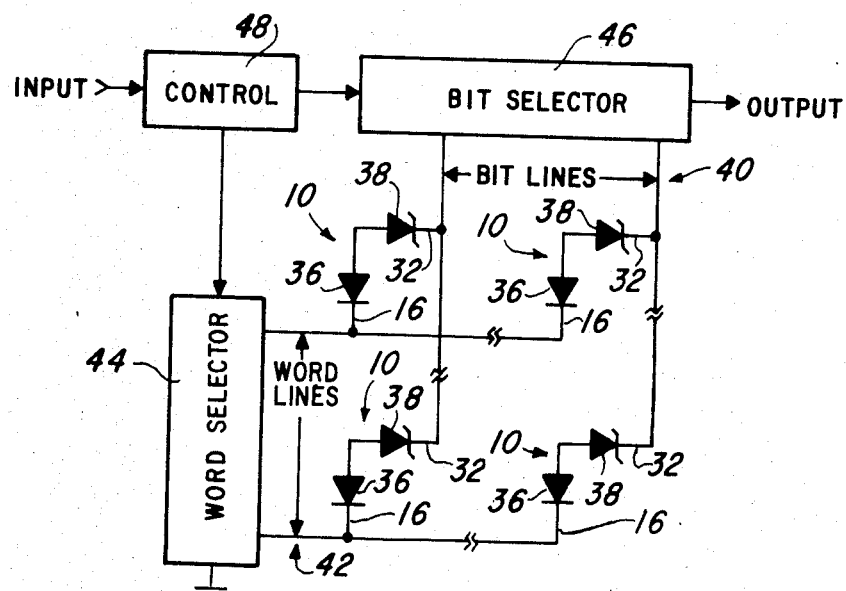
FIG. 2 is an electrical schematic of a memory system having an array of the memory elements of FIG. 1.

When connected in a conventional row-by-column array such as that illustrated in FIG. 2, each memory element 10 may have the metal layer 32 thereof integrated into a selected one of a plurality of bit lines 40 and the buried layer 16 thereof integrated into a selected one of a plurality of word lines 42, so that one and only one of the memory elements 10 is coupled between any particular pair of bit and word lines 40 and 42, respectively. In such an arrangement, a desired one of the memory elements 10 may be selectively programmed by applying programming current to the respective bit line 40 while shunting the respective word line 42 to ground. Thereafter, the logical condition of the bit of information represented by the programmed memory element 10 will be opposite that of a non-programmed memory element 10. This binary system may be readily utilized to form a complete programmable read-only-memory system by adding conventional word and bit selectors 44 and 46, respectively, which are responsive to a suitable control circuit 48.

In a memory element 10 fabricated using the preferred method described above, a voltage differential on the order of 8 volts between a bit line 40 and a word line 42 has been found to be sufficient to break down the programming diode 38, with a programming current on the order of 20–50 milliamps being sufficient to effect permanent programming of the respective memory element 10. Such voltage and current requirements can be satisfied using programming and addressing transistors which are substantially smaller than in prior art devices. In addition, the "short circuit" technique employed in the memory element 10 offers improved reliability over prior art fusible metal link PROM elements since the memory element 10 is not subject to the phenomenon of link "grow back".

Although the present invention has been described herein with reference to a preferred embodiment and method for fabrication thereof in an oxide isolated form, conventional P-N junction isolation techniques may be advantageously employed to fabricate the memory element if desired. Various other changes may be made in the construction or arrangement of the parts or elements of the preferred embodiment and method disclosed herein without departing from the spirit and scope of the present invention as defined in the appended claims.

What is claimed is:

1. A programmable read-only-memory element, comprising:
   a substrate;
   a monocrystalline silicon layer on the substrate;
   a first N-type region in the monocrystalline silicon layer above the substrate;
   a second N-type region in the monocrystalline silicon layer above and adjacent to the first N-type region, the second N-type region having a higher resistivity than the first N-type region;
   a P-type region in the monocrystalline silicon layer above and adjacent to the second N-type region;
   a first PN junction formed at the interface of the P-type region and the second N-type region;
   a third N-type region in the monocrystalline silicon layer above and adjacent to the P-type region;
   a second PN junction formed at the interface of the third N-type region and the P-type region;
   an N-type polycrystalline silicon layer on an upper surface of the monocrystalline silicon layer in contact with the third N-type region;
   a metal layer consisting essentially of aluminum contacting the polycrystalline silicon layer above and spaced from the third N-type region;
   wherein the vertical dimension from the first PN junction to the polycrystalline silicon layer greatly exceeds the vertical dimension from the second PN junction to the polycrystalline silicon layer, such that a programming voltage impressed on the metal layer relative to the first N-type region to reverse bias the second PN junction will cause aluminum to migrate through the polycrystalline silicon layer to short the second PN junction without shorting the first PN junction.

2. The memory element of claim 1 wherein the vertical dimension from the first PN junction to the polycrystalline silicon layer is from about 0.6 to about 0.8 microns.

3. The memory element of claims 1 or 2 wherein the third N-type region is formed by diffusion of N-type impurities from the polycrystalline silicon layer into a shallow upper surface portion of the monocrystalline silicon layer altering the conductivity thereof from P-type to N-type.

4. A memory element formed on a substrate, the element comprising a conductive layer disposed above an upper surface of the substrate;
   a semiconductor structure, the semiconductor structure including a monocrystalline layer disposed above the conductive layer and a polycrystalline layer disposed above and contacting an upper surface of the monocrystalline layer, the monocrystalline layer having a PN junction disposed therein in a plane substantially parallel to the upper surface of the substrate;

a metal layer contacting an upper surface of the polycrystalline layer;

impedance means in the semiconductor structure above the PN junction for providing an electrical impedance between the metal layer and the conductive layer when the PN junction is forward biased; and means for permanently reducing the impedance level of the impedance means from a first level indicative of a first memory state to a second level indicative of a second memory state by raising the voltage across the semiconductor structure until at least some portion of the metal from the metal layer migrates through the polycrystalline layer to the monocrystalline layer.

5. The memory element of claim 4 wherein the impedance means comprises a second PN junction in the semiconductor structure.

6. The memory element of claim 5 wherein the second PN junction is disposed in the monocrystalline layer near the upper surface thereof.

7. The memory element of claim 6 wherein the second PN junction and the first-mentioned PN junction are disposed substantially in parallel planes separated by a P-type region in the monocrystalline layer.

8. In a programmable read-only-memory formed on a substrate, the memory element comprising:

an epitaxial layer disposed on the substrate;

a decoupling diode disposed in the epitaxial layer;

a programming diode disposed in the epitaxial layer above the decoupling diode, the programming diode and the decoupling diode conducting vertically in electrical series relationship in the epitaxial layer and having opposing polarities;

a polycrystalline silicon layer disposed on the epitaxial layer;

a metal layer disposed on the polycrystalline layer; and means for impressing a voltage on the memory element to permanently breakdown the PN junction of the programming diode without breaking down the PN junction of the decoupling diode.

9. A progammable read-only-memory element, comprising:

a substrate;

a monocrystalline silicon layer on the substrate;

a first region of a first conductivity type in the monocrystalline silicon layer;

a second region of a second conductivity type in the monocrystalline silicon layer above and adjacent to the first region;

a first PN junction at the interface of the first and second regions;

a third region of the first conductivity type in the monocrystalline silicon layer above and adjacent to the second region;

a second PN junction at the interface of the second and third regions;

a polycrystalline silicon layer on an upper surface of the monocrystalline silicon layer in contact with the third region;

a metal layer contacting the polycrystalline silicon layer above and spaced from the third region; and means for impressing a voltage on the memory element to permanently break down the second PN junction without breaking down the first PN junction.

10. The memory element of claim 9 wherein said first conductivity type is N-type and said second conductivity type is P-type and wherein said polycrystalline silicon layer is doped with N-type impurities.

11. The memory element of claim 10 wherein said metal layer consists essentially of aluminum.

* * * * *